(12) United States Patent
Al-Rabadi

(10) Patent No.: US 7,508,039 B2
(45) Date of Patent: Mar. 24, 2009

(54) CARBON NANOTUBE (CNT) MULTIPLEXERS, CIRCUITS, AND ACTUATORS

(75) Inventor: Anas N. Al-Rabadi, Portland, OR (US)

(73) Assignee: State of Oregon Acting By and Through The State Board of Higher Education On Behalf of Portland State University, Portland, OR (US)

(\*) Notice: Subject to any disclaimer, the term of this patent is extended or adjusted under 35 U.S.C. 154(b) by 315 days.

(21) Appl. No.: 11/122,973

(22) Filed: May 4, 2005

(65) Prior Publication Data

US 2005/0250305 A1   Nov. 10, 2005

Related U.S. Application Data

(60) Provisional application No. 60/568,147, filed on May 4, 2004.

(51) Int. Cl.
*H01L 21/44* (2006.01)
(52) U.S. Cl. .................. 257/414; 257/213; 257/401; 257/E29.082; 257/E29.322; 438/614; 365/151; 365/164; 977/700; 977/839; 977/940
(58) Field of Classification Search .................. 257/20, 257/213, 288, 368, 401, 414, E29.082, E29.322; 438/614; 365/151, 164, 165; 977/700, 708, 977/731, 839, 940, 943, 948
See application file for complete search history.

(56) References Cited

U.S. PATENT DOCUMENTS 4,238,748 A * 12/1980 Goullin et al. ................ 335/56

| | | | |
|---|---|---|---|
| 2002/0027819 A1* | 3/2002 | Tomanek et al. | 365/215 |
| 2002/0173083 A1* | 11/2002 | Avouris et al. | 438/129 |
| 2004/0238907 A1* | 12/2004 | Pinkerton et al. | 257/419 |
| 2005/0036365 A1* | 2/2005 | Bertin et al. | 365/163 |

OTHER PUBLICATIONS

P.G. Collins and P. Avouris, "Nanotubes for Electronics," Scientific American, pp. 62-69 (Dec. 2000).
G. Amaratunga, "Watching the Nanotube," IEEE Spectrum, pp. 28-32 (Sep. 2003).
J. Jiao et al., "High-Yield Synthesis of Carbon Coils on Tungsten Substrates and their Behavior in the Presence of an Electric Field," J. Mater. Res. 18:2580-2587 (2003).
J.R. Heath et al. "Molecular Electronics," Physics Today 56:43-49 (May 2003).

(Continued)

*Primary Examiner*—Sue A Purvis
*Assistant Examiner*—Fazli Erdem
(74) *Attorney, Agent, or Firm*—Klarquist Sparkman, LLP

(57) ABSTRACT

Carbon nanotube (CNT) based devices include an actuator/switch that includes one or more fixed CNTs and a moveable CNT that can be urged toward or into contact with a selected fixed CNT with a magnetic field produced by a current in a control conductor. The control conductor can be formed of one or more CNTs, and the fixed and moveable CNTs can be retained by a support, and motion of the moveable CNT limited by a cavity defined in the support. In other examples, CNT FETS are used to form CNT transmission gates that are arranged to define circuits configured as multiplexers or to realize logical functions, addition, multiplication, or other operations such as Galois field arithmetic.

7 Claims, 3 Drawing Sheets

OTHER PUBLICATIONS

K. Likharev, "Hybrid Semiconductor-Molecular Nanoelectronics," The Industrial Physicist, pp. 20-23 (Jun./Jul. 2003).

P.G. Collins et al., "Engineering Carbon Nanotubes and Nanotube Circuits Using Electrical Breakdown," Science, 292 (Apr. 2001).

V. Derycke et al., "Carbon Nanotube Inter- and Intramolecular Logic Gates," Nano Letters 0 (Aug. 2001).

Nanotubes and Buckyballs, http://nanotech-now.com/nanotube-buckyball-sites.htm, 6 pages, accessed May 2, 2006.

Multi Disciplinair Project: Wondrous World of Carbon Nano Tubes, http://students.chem.tue.nl/ifp03/synthesis.html, 23 pages, accessed May 2, 2006.

Ray-traced images gallery of nanotechnology and other carbon based molecules—Dr. Chri . . . http://www.ewels.info/img/science/, accessed May 2, 2006.

Nanotechnology Gallery, http://www.ipt.arc.nasa.gov/carbonnano.html, accessed May 2, 2006.

Devices and Nanotechnology, http://www.ipt.arc.nasa.gov/finnfigures.html, accessed May 2, 2006.

* cited by examiner

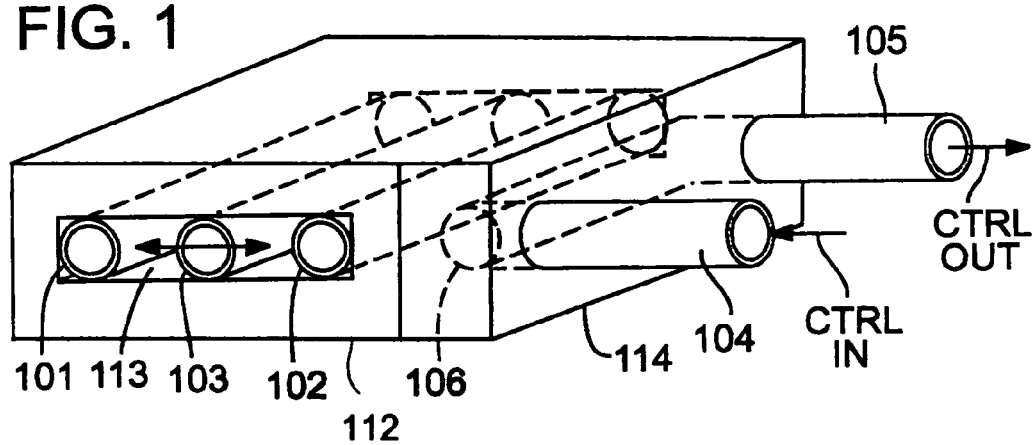
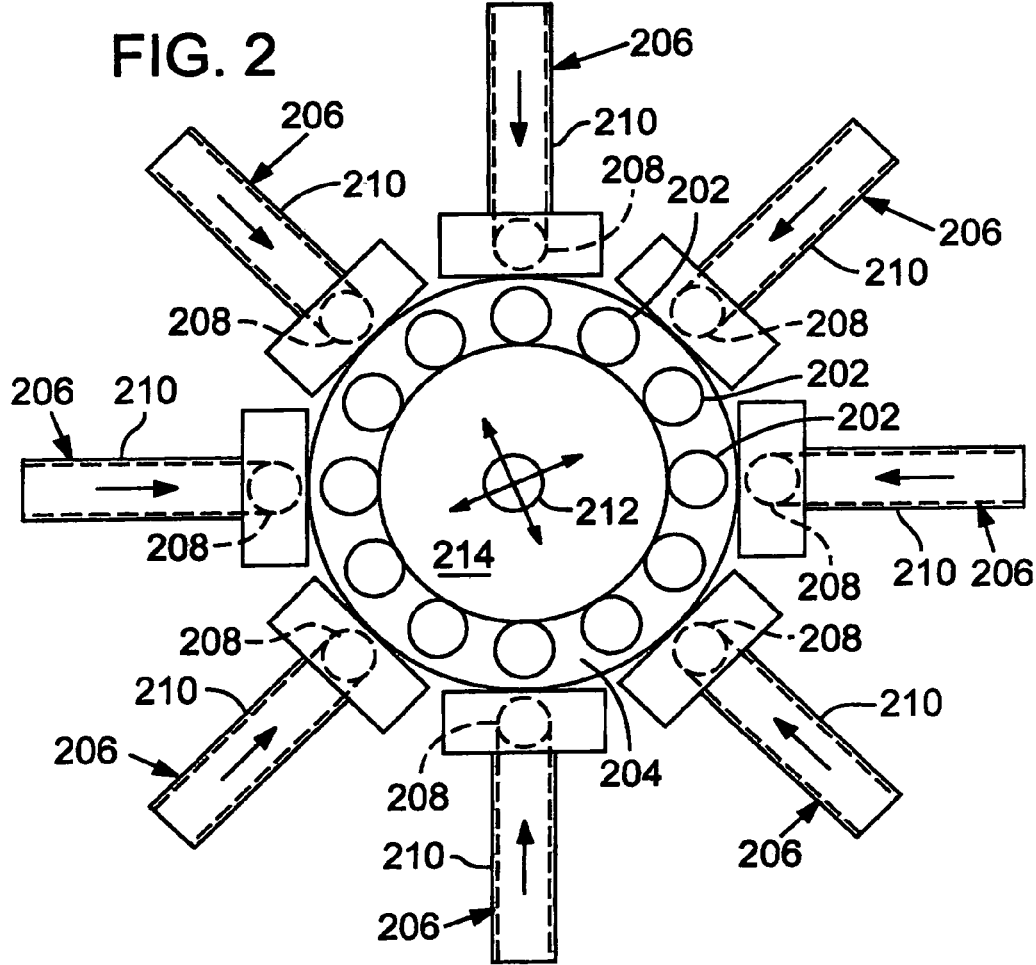

CARBON NANOTUBE (CNT) MULTIPLEXERS, CIRCUITS, AND ACTUATORS

CROSS REFERENCE TO RELATED APPLICATIONS

This application claims the benefit of U.S. Provisional Patent Application No. 60/568,147, filed May 4, 2004 and that is incorporated herein by reference.

TECHNICAL FIELD

The disclosure pertains to carbon nanotube devices.

BACKGROUND

Miniaturization of electronic and mechanical devices has permitted complex and sophisticated products to be realized inexpensively in compact packages. Such miniaturization has developed based primarily on advances in silicon wafer processing, either for circuit fabrication or for micro-electromechanical systems. While silicon wafer processing has continued to improve, such improvements tend to be incremental, and cannot offer significant reductions in device size. Thus, improved electrical and mechanical devices are needed targeted to reducing device size and increasing device density.

SUMMARY

In some examples, devices comprise first and second fixed carbon nanotubes (CNTs) and a moveable CNT. A conductor is configured to receive an electrical current and produce a magnetic field associated with the current, wherein the magnetic field is configured to urge the moveable CNT towards the first fixed CNT or the second fixed CNT. In representative examples, the conductor is configured so that the magnetic field is configured to urge the moveable CNT into contact with the first fixed CNT or the second fixed CNT. In additional examples, a support is configured to secure the first and second fixed CNTs and the support includes a recess configured to receive the movable CNT. In further representative examples, the conductor includes a portion that is substantially parallel to the moveable CNT. In other examples, the conductor comprises at least one CNT. In still other examples, an output terminal is in electrical communication with the moveable CNT or a mechanical coupling is in communication with the moveable CNT.

In other representative examples, multiplexer circuits comprise a first carbon nanotube (CNT) transmission gate coupled to receive a first input signal at a first input terminal and a control signal at a control input, and a second CNT transmission gate coupled to receive a second input signal and the control signal at a control input. The first and second CNT transmission gates are coupled to selectively communicate one of the first input signal and the second input signal to an output terminal based on the control signal. In additional examples, the control inputs of the first and second CNT transmission gates include terminals coupled to receive the control signal and a logical complement of the control signal. In further examples, the first CNT transmission gate comprises a p-type CNT FET and an n-type CNT FET, and the second CNT transmission gate comprises a p-type CNT FET and an n-type CNT FET. In additional examples, the first CNT transmission gate comprises a CNT having an n-type region and a p-type region.

In representative examples, a current is established in a moveable CNT, typically by contacting a CNT in which a current has been previously established. A control conductor is provided with a control electrical current that is selected to urge the moveable CNT away from the contacted CNT (or towards the contacted CNT) based on a current direction.

The foregoing and other objects, features, and advantages of the technology will become more apparent from the following detailed description, which proceeds with reference to the accompanying figures.

BRIEF DESCRIPTION OF THE DRAWINGS

FIG. 1 is a schematic diagram of a representative actuator/multiplexer that includes carbon nanotubes.

FIG. 2 is a schematic diagram of a representative actuator/multiplexer that includes carbon nanotubes.

DETAILED DESCRIPTION

Figure 3A:
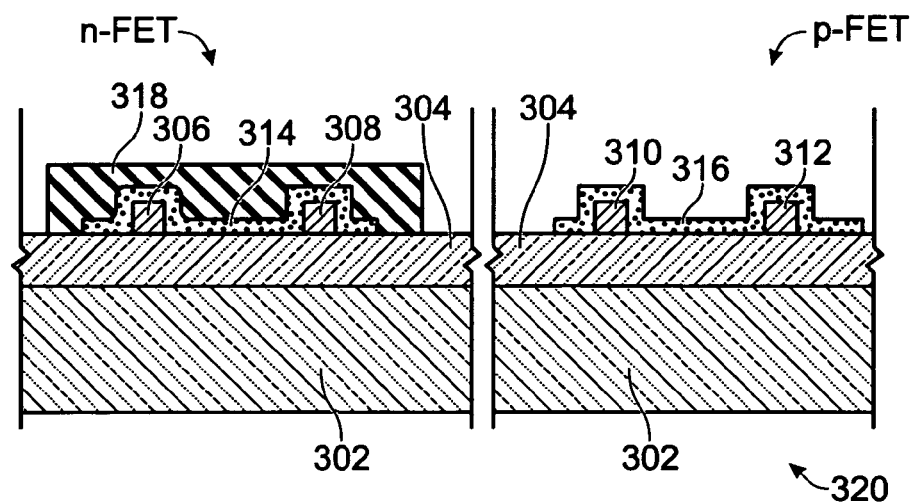
FIGS. 3A-3B are schematic diagrams of a representative CNT FET transmission gate.

As used in this application and in the claims, the singular forms "a," "an," and "the" include the plural forms unless the context clearly dictates otherwise. Additionally, the term "includes" means "comprises." Further, the term "coupled" means electrically or electromagnetically connected or linked and does not necessarily exclude the presence of intermediate elements between the coupled items.

Disclosed below are representative embodiments that may be used in various applications. Exemplary environments and applications for the disclosed embodiments are also disclosed. The described systems, methods, and apparatus should not be construed as limiting in any way. Instead, the present disclosure is directed toward all novel and nonobvious features, aspects, and equivalents of the various disclosed embodiments, alone and in various combinations and subcombinations with one another. The disclosed systems, methods, and apparatus are not limited to any specific aspect, feature, or combination thereof, nor do the disclosed systems, methods, and apparatus require that any one or more specific advantages be present or problems be solved.

For the sake of simplicity, the attached figures may not show the various ways in which the disclosed systems, methods, and apparatus can be used in conjunction with other systems, methods, and apparatus. Components that are well known in the art are not described in further detail.

Conventional circuits, actuators, and other devices typically encounter performance limitations based on device size and material properties. Carbon nanotubes (CNTs) offer both small dimensions and improved material properties so that CNT-based devices can offer superior device performance in a nanometer-scale device. CNTs generally can be obtained in one of two forms. One type of nanotube, referred to as a multi-wall CNT (MWCNT) consists of several hollow cylinders of carbon atoms nested inside each other. In another form known as a single-wall CNT (SWCNT), a single layer of carbon atoms is arranged to form a tube. Yet another CNT configuration is carbon nanocoil in which carbon atoms are arranged in a coil-like shape. CNTs are described in further detail in, for example, P. G. Collins and P. Avouris, "Nanotubes for Electronics," Scientific American, pp. 62-69 (December 2000), G. Amaratunga, "Watching the Nanotube," IEEE Spectrum, pp. 28-32 (September 2003), J. Jiao et al., "High-Yield Synthesis of Carbon Coils on Tungsten Substrates and their Behavior in the Presence of an Electric Field", J. Mater. Res. 18:2580-2587 (2003), and J. R. Heath, and M. A. Ratner, "Molecular Electronics," Physics Today 56(5):43-49 (2003), which are incorporated by reference herein.

Representative examples of CNT circuits and actuators are illustrated in FIGS. 1-2. With reference to FIG. 1, a CNT device includes CNTs 101, 102, 103 that are situated in a cavity 113 defined in a support 112 made of, for example, an insulator such as quartz, glass, or other dielectric material. The CNTs 101, 102 are generally fixed in position, while the CNT 103 can move within the cavity 103 towards either of the CNTs 101, 102. A control unit includes a support 114 that receives control input/output CNTs 104, 105, and a CNT 106 is secured by the support 114. The support is generally made of an insulator such as glass, silicon dioxide, plastic, or other insulator. The CNTs 104, 105, 106 are configured to form a conductor having, in the example of FIG. 2, a "U" shape. The CNT 106 is arranged so that the CNTs 101, 102, 103, 106 are substantially parallel.

Application of current to the control unit (CNTs 104, 105, 106) can be configured to produce magnetic forces on the CNT 103 such that the CNT 103 moves toward or into contact with either the CNT 101 or the CNT 102. Upon contact, an electrical signal provided to either of the fixed CNTs 101, 102 is then coupled to the CNT 103, and can be delivered as an output. The direction of the applied current can be reversed so that the CNT 103 can be directed toward either of the CNTs 101, 102. Thus, the CNT device of FIG. 1 can serve as a multiplexer in that one of two analog or digital inputs can be delivered to the CNT 103 as an output. Alternatively, motion of the CNT 103 can be coupled to external devices so that the CNT device serves as a CNT motor or actuator.

Referring to FIG. 2, a plurality of CNTs 202 are situated in a support 204. As shown in FIG. 2, a plurality of control units 206 are provided that are configured to receive electrical currents and deliver the received electrical currents to CNTs 208 that are substantially parallel to the CNTs 202. Each of the control units 206 in the example of FIG. 2 also includes input/output CNTs such as CNTs 210, but only one input/output CNT is shown for each in the sectional view of FIG. 2. This arrangement is similar to that of FIG. 1. Additional or fewer controllers can also be provided. A central CNT 212 is thus movable within a cavity 214 based on currents applied to the control units. Such a CNT device can serve as an N:1 analog/digital multiplexer (N is an integer greater than or equal to 2) based on the number of CNTs 202, or as a CNT motor or actuator that can provide two dimensional motion. The central CNT 212 can be moved into contact with any of the CNTs 202, or moved towards any of the CNTs 202 without contact with the CNTs 202. Generally, the position of the CNT 212 can be continuously translated or adjusted in two dimensions based on magnitudes and directions of currents in the CNTs 202, 210. The CNT 212 is typically initially in contact with one of the fixed CNTs 202 to acquire a current. A directional controller can be provided to determine currents to be provided to the control units. Such a controlled can be conveniently implemented with a microprocessor, personal computer, handheld computer, or application specific integrated circuit.

In other examples of two dimensional CNT devices, three or more fixed CNTs such as the CNTs 202 can be used, and two or more control units that include control CNTs such as the CNTs 208 can be provided. For example, three fixed CNTs can be used in conjunction with two control units and two control CNTs to provide two dimensional actuation. The examples of FIGS. 1-2 are representative examples selected for convenient explanation.

Figure 3B:
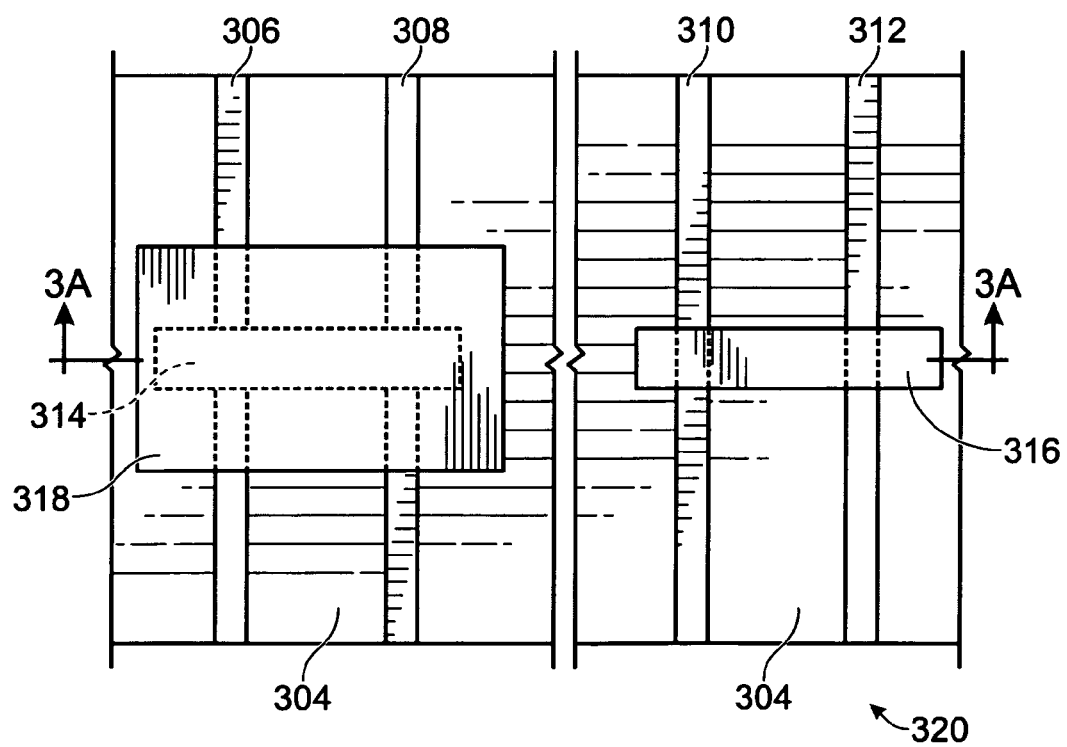

A representative CNT FET based 2:1 multiplexer circuit is illustrated in FIGS. 3A-3B. A gate layer 302 is provided with an insulating layer 304. Source/drains 306, 308, 310, 312 are situated at or on the insulating layer 304. CNTs 314, 316 are situated to electrically couple respective sources/drains as controlled by respective voltages applied to the gate layer 302. While the CNTs 314, 316 can be provided by contacting CNTs with the sources/drains, in other examples, CNTs can be grown between the sources and drains. Sources/drains can be formed of, for example, gold, platinum, or other materials, and the gate layer 302 and the insulating layer 304 can be conveniently provided as a silicon layer and a silicon oxide layer, respectively, but other materials can be used. While CNTs such as the CNTs 314, 316 are typically p-type, an n-type CNT can be provided by potassium doping in a vacuum, vacuum annealing, electrostatic doping, or other method. n-type CNTs typically revert to p-type upon exposure to air or other normal ambients, and oxygen can be used to convert an n-type CNT to a p-type CNT. A protective layer 318 can be provided so that n-type CNTs remain n-type. The layer 318 can be formed of, for example, polymethyl methacrylate (PMMA), silicon dioxide, or other materials. As shown in FIGS. 3A-3B, the layer 318 is configured to protect only the CNT 314 that is configured as an n-type nanotube. While the layer 318 can be extended to protect the CNT 316, the CNT 316 is configured as p-type CNT, and protection is unnecessary. The CNT FETs form a CNT transmission gate (TG) 320 that can be coupled with additional transmission gates to form multiplexers, logic circuits, or other circuits as described below.

The CNT TG of FIGS. 3A-3B can be formed by, for example, forming two p-type CNT FETs. These CNT FETs are converted to n-type by vacuum annealing, and one of the CNT FETs is provided with a protective coating such as PMMA. The CNT FETs can then be exposed to oxygen at, for example, a pressure of about $10^{-3}$ Torr for about three minutes, so that the unprotected CNT FET reverts to a p-type CNT FET. In some examples, a single CNT or CNT bundle is placed on three conductors (such as gold conductors) that are configured to form sources and drains of an n-type and a p-type CNT FET, with n-type and p-type regions formed in a single CNT.

Figure 4:
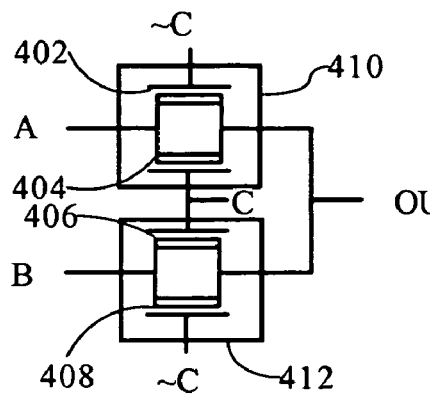
FIG. 4 is a schematic block diagram of a 2:1 CNT FET transmission gate multiplexer.

With reference to FIG. 4, a 2:1 CNT-based multiplexer (MUX) comprises p-type CNT FETs 402, 406 and n-type CNT FETS 404, 408, respectively. The CNT FETS 402, 404 and 406, 408 form CNT transmission gates 410, 412, respectively. Input signals A, B are coupled to respective CNT transmission gates at signal input terminals, and a control signal C or its logical complement ~C are applied to control input terminals. If C is a logical "1", then the TG 410 is activated, and the input A is delivered to the output. If C is a logical "0", then the TG 412 is activated, and the input B is delivered to the output.

Figure 5A:
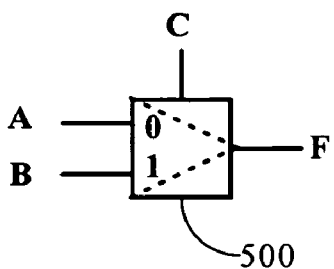
FIGS. 5A-5B illustrate CNT based circuits configured for multiple valued computation.
Figure 5B:
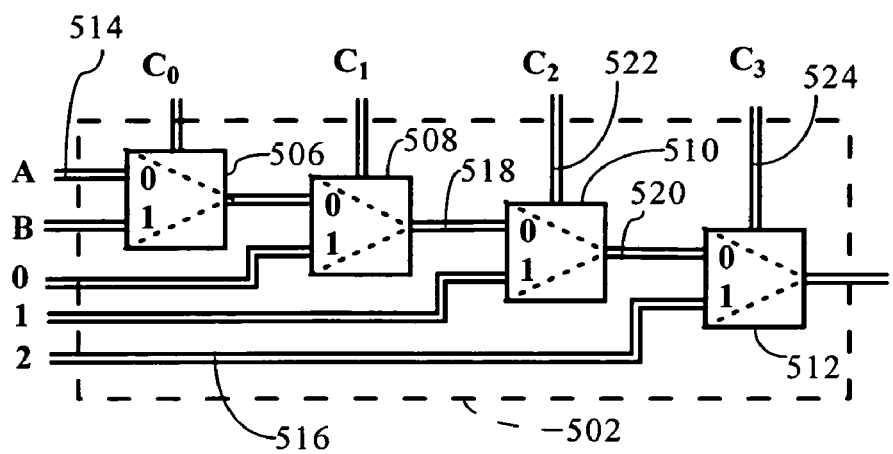

A representative arrangement of CNT FET based MUXes is illustrated in FIGS. 5A-5B. In this example, a circuit is configured for multiple valued computation for the ternary radix Galois field GF(3). FIG. 5A is a block diagram illustrating a representation 500 of a CNT based MUX, and FIG. 5B is a block diagram of a circuit 502 configured to implement addition or multiplication in GF(3). Selection of an input for signal coupling to the output using the circuit 500 is described in Table 1. For convenience, the input terminals of the circuit 500 can be referred to as "0" and "1" inputs as shown in FIG. 5A. CNT MUXes can take various forms based on CNT FETs or magnetically switchable CNT actuators as described above.

TABLE 1

Control Logic for a CNT MUX.

| A | B | C | F |
|---|---|---|---|
| a | b | 0 | a |
| a | b | 1 | b |

Addition and multiplication tables for a sum A+B and a product A*B in GF(3) are shown in Tables 2A-2B, respectively, wherein A, B are elements of GF(3).

TABLE 2A

GF(3) Addition

| | B | | |
|---|---|---|---|
| A | 0 | 1 | 2 |
| 0 | 0 | 1 | 2 |
| 1 | 1 | 2 | 0 |
| 2 | 2 | 0 | 1 |

TABLE 2B

GF(3) Multiplication

| | B | | |
|---|---|---|---|
| A | 0 | 1 | 2 |
| 0 | 0 | 0 | 0 |
| 1 | 0 | 1 | 2 |
| 2 | 0 | 2 | 1 |

As shown in FIG. 5B, the circuit 502 includes CNT MUXes 506, 508, 510, 512 connected in series and having output terminals that are connected to a "0" input of the next CNT MUX in the series. Other series and parallel connections of CNT MUXes can be provided based on an intended application. In particular, series connections can use "0" or "1" inputs or a combination thereof for connection to an output of a previous stage. Connections such as representative connections 514, 516, 518, 520, 522, 524 can be based on CNTs or conventional conductors can be used. In representative examples, some, all, or a selected set of connections are formed with CNTs while other connections are conventional conductors or some other type of connection. Input signals A, B represent ternary input variables that can assume any one of the values (0, 1, 2). Inputs 0, 1, 2 are constant values, and inputs Ck (k=0, 1, 2, 3) are two-valued control variables having one of the values (0, 1). The circuit 502 is configured for GF(3) addition or multiplication based on a selection of appropriate control variables $C_k$ as specified in Table 3. The control variable values noted as +C are for addition while values associated with *C are for multiplication.

TABLE 3

Control Values for the Circuit of FIG. 5B.

| A | B | $+C_0$ | $+C_1$ | $+C_2$ | $+C_3$ | $*C_0$ | $*C_1$ | $*C_2$ | $*C_3$ |
|---|---|---|---|---|---|---|---|---|---|
| 0 | 0 | 0 | 0 | 0 | 0 | 0 | 0 | 0 | 0 |
| 0 | 1 | 1 | 0 | 0 | 0 | 0 | 0 | 0 | 0 |
| 0 | 2 | 1 | 0 | 0 | 0 | 0 | 0 | 0 | 0 |
| 1 | 0 | 0 | 0 | 0 | 0 | 1 | 0 | 0 | 0 |
| 1 | 1 | 0 | 0 | 0 | 1 | 0 | 0 | 0 | 0 |
| 1 | 2 | 0 | 1 | 0 | 0 | 1 | 0 | 0 | 0 |
| 2 | 0 | 0 | 0 | 0 | 0 | 1 | 0 | 0 | 0 |
| 2 | 1 | 0 | 1 | 0 | 0 | 0 | 0 | 0 | 0 |
| 2 | 2 | 0 | 0 | 1 | 0 | 0 | 0 | 1 | 0 |

Figure 6:
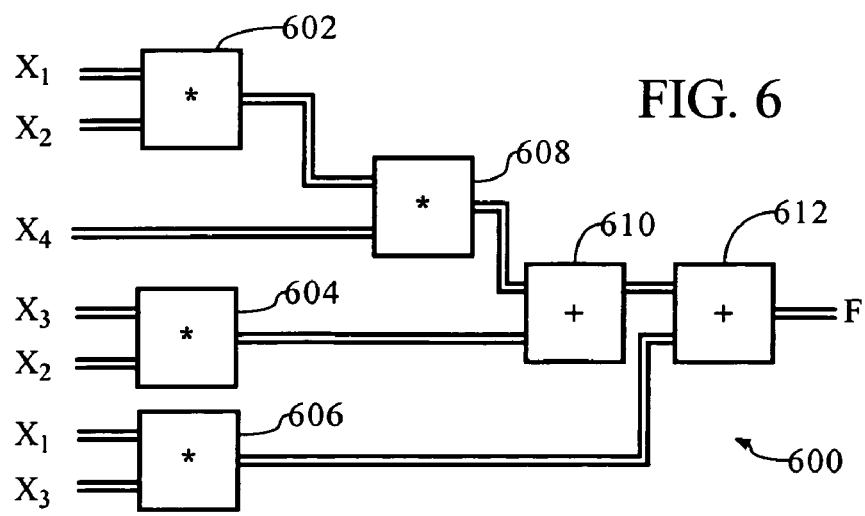
FIG. 6 is a schematic diagram of a circuit that includes multiplexers and that implements a ternary function.

As shown above, the circuit of FIG. 5B can be configured to perform either multiplication or addition in GF(3). Addition and multiplication operations are used in the synthesis of circuits configured to perform many particular functions, so that the circuit of FIG. 5A can be used to implement such functions. A representative example circuit 600 that implements the ternary function $F=x_1x_2x_4++x_3x_2+x_1x_3$ is illustrated in FIG. 6. The circuit includes multipliers 602, 604, 606, 608 and adders 610, 612 that are based on the circuit of FIG. 5A. Circuit interconnects in FIG. 6 can be based on CNTs or other connections can be used. In some examples, circuit interconnections are provided by SWCNTs grown between catalyst islands of, for example, iron, cobalt, nickel, yttrium, or molybdenum.

While representative examples of CNT circuits, actuators, and other devices are described above, these examples are selected for convenient explanation and are not to be taken as limiting. Representative methods of assembling such devices are also provided, and these methods can be tailored for manufacture of particular devices. The disclosed examples are selected for convenience in illustrating the disclosed technology. None of these examples is to be taken as limiting, and we claim all that is encompassed by the appended claims.

I claim:

1. An actuator, comprising:
   an unfixed carbon nanotube coupled to a mechanical output; and
   a control conductor configured to receive an electrical current and situated so that a magnetic field produced by the current in the conductor exerts a magnet force on the unfixed carbon nanotube, wherein the unfixed carbon nanotube is situated between first and second fixed carbon nanotubes that are coupled to receive respective electrical currents, and the control conductor is situated so that the electrical current in the control conductor magnetically urges the unfixed carbon nanotube toward at least one of the first and the second fixed carbon nanotubes.

2. The actuator of claim 1, wherein the unfixed carbon nanotube is confined in a cavity defined in a support.

3. An actuator, comprising:
   an unfixed carbon nanotube coupled to a mechanical output;
   a control conductor configured to receive an electrical current and situated so that a magnetic field produced by the current in the conductor exerts a magnet force on the unfixed carbon nanotube;
   a plurality of fixed carbon nanotubes oriented along an axis and distributed circumferentially about the axis, each of the plurality of nanotubes configured to receive an electrical current; and a plurality of control units, each of the control units configured to receive a control current and situated so as to be in magnetic communication with the unfixed carbon nanotube, wherein the unfixed carbon nanotube is configured to be urged in at least two orthogonal directions based on control currents applied to at least one control unit.

4. The actuator of claim 3, wherein the control units include carbon nanotubes configured to receive the respective control currents.

5. The actuator of claim 4, further comprising a directional controller configured to select an unfixed nanotube position and provide corresponding currents to the control units.

6. The actuator of claim 3, wherein the at least two directions are substantially perpendicular to the axis.

7. The actuator of claim 3, wherein the at least two directions include at least one direction that is substantially parallel to the axis.

* * * * *